United States Patent
Seger et al.

(10) Patent No.: US 8,917,323 B2
(45) Date of Patent: Dec. 23, 2014

(54) IMAGE CAPTURE SYSTEM FOR APPLICATIONS IN VEHICLES

(75) Inventors: Ulrich Seger, Warmbronn (DE); Uwe Apel, Neckartailfingen (DE); Christian Hoellt, Schoeneck (DE)

(73) Assignee: Robert Bosch GmbH, Stuttgart (DE)

( * ) Notice: Subject to any disclaimer, the term of this patent is extended or adjusted under 35 U.S.C. 154(b) by 804 days.

(21) Appl. No.: 12/302,402

(22) PCT Filed: Jul. 13, 2007

(86) PCT No.: PCT/EP2007/057221
§ 371 (c)(1),
(2), (4) Date: May 18, 2009

(87) PCT Pub. No.: WO2008/025610
PCT Pub. Date: Mar. 6, 2008

(65) Prior Publication Data
US 2010/0026805 A1    Feb. 4, 2010

(30) Foreign Application Priority Data
Aug. 30, 2006  (DE) .......................... 10 2006 040 657

(51) Int. Cl.
*H04N 7/18* (2006.01)
*H04N 5/225* (2006.01)
*G02B 3/00* (2006.01)

(52) U.S. Cl.
CPC ........... *H04N 5/2252* (2013.01); *H04N 5/2254* (2013.01); *G02B 3/0056* (2013.01)
USPC ........................................................ 348/148

(58) Field of Classification Search
CPC ... G02B 3/0056; H04N 5/2254; H04N 5/2252

USPC .......................................................... 348/148
See application file for complete search history.

(56) References Cited

U.S. PATENT DOCUMENTS 5,442,482 A * 8/1995 Johnson et al. ............... 359/619
5,729,016 A * 3/1998 Klapper et al. ............... 250/334

(Continued)

FOREIGN PATENT DOCUMENTS

DE          199 17 890        11/2000
DE      10 2004 003 013        6/2005

(Continued)

OTHER PUBLICATIONS

Volkel et al., "Miniaturized Imaging Systems," Microelectronic Engineering, Elsevier Publishers BV., Amsterdam, NL, vol. 67-68, Jun. 2003, pp. 461-472, XP004428906, ISSN: 0167-9317, Figure 1.

(Continued)

*Primary Examiner* — Jimmy H Tran
*Assistant Examiner* — Marcus McKenzie
(74) *Attorney, Agent, or Firm* — Kenyon & Kenyon LLP

(57) ABSTRACT

In an image capture system for use in vehicles as well as an optical system for use in the automotive sector, the image capture system has at least one image sensor element having a plurality of image sensors situated in an image plane and at least one micro-lens system having a plurality of micro-lenses. Optionally, at least one aperture mask having a plurality of openings is situated between the micro-lens system and the at least one image sensor element. One image sensor, one micro-lens and one opening respectively define a pick-up direction of the image sensor. The totality of the pick-up directions defines a main viewing direction, which together with the image plane encloses an angle α of less than 80°.

12 Claims, 3 Drawing Sheets

(56) References Cited

U.S. PATENT DOCUMENTS

| | | | |
|---|---|---|---|
| 5,760,962 A | 6/1998 | Schofield et al. | |
| 6,166,764 A * | 12/2000 | Sakata | 348/148 |
| 6,489,887 B2 * | 12/2002 | Satoh et al. | 340/436 |
| 6,617,564 B2 * | 9/2003 | Ockerse et al. | 250/208.1 |
| 6,681,163 B2 * | 1/2004 | Stam et al. | 701/36 |
| 6,757,109 B2 * | 6/2004 | Bos | 359/753 |
| 6,861,636 B2 * | 3/2005 | Ockerse et al. | 250/208.1 |
| 6,928,194 B2 * | 8/2005 | Mai et al. | 382/284 |
| 7,058,252 B2 * | 6/2006 | Woodgate et al. | 385/16 |
| 7,423,821 B2 * | 9/2008 | Bechtel et al. | 359/796 |
| 2001/0055069 A1 * | 12/2001 | Hudson | 348/302 |
| 2002/0008917 A1 * | 1/2002 | Daniell | 359/622 |
| 2002/0047898 A1 * | 4/2002 | Mindl et al. | 348/113 |
| 2002/0067411 A1 * | 6/2002 | Thompson et al. | 348/207 |
| 2002/0095246 A1 * | 7/2002 | Kawazoe | 701/1 |
| 2002/0113753 A1 * | 8/2002 | Sullivan et al. | 345/6 |
| 2003/0066948 A1 * | 4/2003 | Ockerse et al. | 250/208.1 |
| 2003/0090753 A1 * | 5/2003 | Takeyama et al. | 359/15 |
| 2003/0169522 A1 | 9/2003 | Schofield et al. | |
| 2003/0201380 A1 * | 10/2003 | Ockerse et al. | 250/208.1 |
| 2004/0130629 A1 * | 7/2004 | Koch et al. | 348/217.1 |
| 2004/0190573 A1 * | 9/2004 | Kruschwitz et al. | 372/39 |
| 2004/0218083 A1 * | 11/2004 | Thompson et al. | 348/335 |
| 2006/0055811 A1 * | 3/2006 | Frtiz et al. | 348/340 |
| 2006/0289956 A1 * | 12/2006 | Boettiger et al. | 257/432 |
| 2007/0035539 A1 * | 2/2007 | Matsumura et al. | 345/419 |
| 2007/0109438 A1 * | 5/2007 | Duparre et al. | 348/335 |
| 2009/0109541 A1 * | 4/2009 | Boettiger et al. | 359/620 |

FOREIGN PATENT DOCUMENTS

| | | |
|---|---|---|
| JP | 2004-82829 | 3/2004 |
| WO | WO 99/26419 | 5/1999 |

OTHER PUBLICATIONS

International Search Report, PCT/EP2007/057221, dated Nov. 12, 2007.

* cited by examiner

IMAGE CAPTURE SYSTEM FOR APPLICATIONS IN VEHICLES

FIELD OF THE INVENTION

The present invention relates to an image capture system for applications in vehicles.

BACKGROUND INFORMATION

In modern motor vehicles, camera systems are already used today to monitor and/or capture the interior and/or exterior areas. Thus, for example, camera systems in the interior are used for monitoring occupants of the vehicle, for example, so as to be able to control safety systems in accordance with an occupancy of the seats and/or a current posture of the vehicle's occupants. Camera systems for the exterior are used, for example, as backup aids or also for capturing an area ahead of the motor vehicle, for example.

Such camera systems, in particular camera systems for capturing the area ahead of the motor vehicle are usefully mounted behind a vehicle window pane, for example a windshield, so as to protect particularly the sensitive sensor system of the camera systems against the extreme environmental impacts to which a motor vehicle is exposed. Another effect is that the field of vision of the camera systems may be kept clear by the windshield wiper(s) of the motor vehicle when it is raining.

In modern motor vehicles, however, windshields have on the upper edge a comparatively flat angle of pitch of approx. 60 degrees with respect to the vertical. Since a lens of the camera system for capturing the area in front of the motor vehicle must be oriented horizontally, however, there is a comparatively large distance between the lower edge of the lens and the windshield, while the upper edge of the lens is often almost flush with the windshield. This distance or gap, which increases in the downward direction, must be covered by one or multiple baffles in order to suppress extraneous light from the interior of the vehicle, which could otherwise enter the optical path of the camera system by reflection in the windshield.

The size of these baffles, however, is associated with various disadvantages. One disadvantage, for example, is the fact that such camera systems having baffles on the whole have a large volume, while only a small space of this built-up volume is actually used. In addition, the expansive baffles are also not desirable from the standpoint of design. Another disadvantage is the fact that the region of the window pane (see-through window), which must be reserved for the camera system, must be dimensioned relatively large because of the comparatively large distance between the camera lens system and the window pane, particularly if the camera is designed for a large horizontal capturing range.

SUMMARY

Example embodiments of the present invention provide a slim-profile image capture system for use in vehicles, in particular in motor vehicles. Such slim-profile image capture systems are conventional from other areas of engineering. Thus, for example, DE 199 17 890 describes a slim-profile image capture system having a lens matrix system containing a multitude of micro-lenses situated side-by-side. Furthermore, a flat photodetector system is provided. The image capture system is constructed in analogy to a compound eye known from the world of insects. The photodetector system has a multitude of light-sensitive pixels, each pixel as a rule being equipped only with one lens of its own or even with an objective lens made up of multiple lenses. On account of the location of the main points of the lens matrix system and on account of the position of the light-sensitive elements of the photodetector, each pixel is given its own direction of view. DE 199 17 890 provides in particular for equipping wrist or pocket watches, mobile communication terminal devices, portable computers, eyeglasses or garments to be equipped with such slim-profile image capture systems.

Similar systems as in DE 199 17 890 are also described in J. Duparre et al.: "Thin compound-eye camera", Applied Optics 44 (15), 2005, pages 2949 ff. and J. Duparre et al.: "Microoptical telescope compound eye", Optics Express 13 (3), 2005, pages 889 ff. Particularly the first described document describes furthermore that an aperture mask may also be used which is positioned specifically across from the pixels and the micro-lenses so as to specify a direction of view for the pixels. Additionally, there is also a provision for opaque walls to be disposed between the individual channels in order to prevent crosstalk from undesired directions (ghosting). Photolithographic techniques are provided for manufacturing the micro-lenses. WO 99/26419 also describes a slim-profile optoelectronic camera. Similarly as in DE 199 17 890, the camera is based on the use of a matrix of micro-lenses. Furthermore, a detector is in turn provided, which is made up of individual detectors in the form of sensor pixels.

Example embodiments of the present invention use the image capture systems existing in conventional systems in vehicles, in particular in motor vehicles. Such compound eye-like image capture systems allow for the above-described volume problem to be at least partially avoided since these may be manufactured in an extremely slim profile. Particularly the micro-lens arrays used for this purpose may have a very small size compared to the smallest objective lenses.

In this instance, however, the problem continues to exist that the conventional image capture systems, when used behind sloped window panes, in particular behind the described windshields, would have to exhibit an increasing distance from the windshield in the downward direction in order to monitor the region ahead of the motor vehicle. Another aspect of example embodiments of the present invention is thus to modify the image capture systems so that they are optimized for use in motor vehicles. In the image capture systems described above, particularly in the image capture system described in DE 199 17 890, the aperture angle and thus the capture angle of the image capture system is determined by the direction of view of the outermost pixels. Slim-profile cameras typically have a symmetrical layout, i.e. the pixel at the center has a direction of view that is the normal with respect to the plane of the image sensor. This property of the conventional image capture systems is modified accordingly in example embodiments of the present invention.

Thus, an image capture system is provided, which has at least one image sensor element having a plurality of image sensors situated in one image plane and at least one micro-lens system having a plurality of micro-lenses.

Optionally, at least one aperture mask having a plurality of openings is situated between the micro-lens system and at least one image sensor element. This may be a separate component, for example. Alternatively or additionally, the aperture mask may also be integrated in terms of micro-system technology, for example, in that structures, which act as an aperture mask (possibly even as a "secondary effect"), are applied directly on a microelectronic component (erg. a sensor chip or the like of the image sensor element). Circuit trace structures in a layer plane of the image sensor element, for example, may act as an aperture mask for incident light.

One image sensor and one micro-lens (as well as, optionally, one opening of the aperture mask) respectively define a pick-up direction of the pixel. The totality of the pick-up directions defines a main viewing direction. This main viewing direction, for example, may be defined as the viewing direction of a pixel located at the center of the image sensor element, or, alternatively or additionally, the main viewing direction may also be defined as a "mean" (for example, vector addition, angle averaging). In this instance, the main viewing direction of the image capture system is set such that the image plane of the image sensor element and the main viewing direction enclose an angle α of less than 80°, in particular an angle between 15° and 40°, and by special preference between 20° and 35°.

According to example embodiments of the present invention, the main viewing direction is set in such a way that the image capture system may be situated in parallel to a customary windshield having an angle between 55° and 62°. The increasing distance (gap) in the downward direction may be avoided by this setup, while at the same time an approximately horizontal forward viewing direction is ensured nevertheless. Alternatively, the viewing direction may also be tilted slightly downward with respect to the horizontal, for example, by up to 5°, particularly in order to capture a ground region in front of the motor vehicle. Thus image capture systems having a telephoto lens-like design are more suited for an orientation having a horizontal main viewing direction, while short-focal-length image capture systems are normally used at a slight downward tilt of the main viewing direction, for example the mentioned 5° tilt. Other orientations are of course also possible.

An image capture system developed in this manner may thus be mounted, for example, flush or having a uniformly wide air gap with respect to the windshield. Furthermore, an optical system is therefore provided for use in the automotive sector, which features a vehicle having a motor vehicle window pane, in particular a windshield, and an image capture system according to example embodiments of the present invention. For this purpose, the image capture system is mounted in the vehicle such that the image plane is situated substantially in parallel with respect to the windshield, in particular with respect to a region of the windshield adjacent to the image capture region. Substantially may be understood to include also slight deviations from a 0° angle, for example, deviations up to 5°.

Instead of an air gap between the image capture system and the motor vehicle window pane, this space between the image capture system and the motor vehicle window pane may also be filled by an optical material, i.e. by a material that is transparent for the relevant spectral range. For example, an optical cement may be used for mounting the image capture system on the motor vehicle window pane. This elimination of the air gap would also reliably eliminate disadvantageous effects such as condensation or dirt on the surface of the image capture system or on the relevant region of the motor vehicle window pane.

The provided image capture system and the provided optical system thus have significant advantages over traditional image capture systems and optical systems in the automotive sector. In addition to the reduced space requirement already described, particularly an improvement of the imaging properties is to be noted as well. This improvement is in particular due to the fact that in all regions of the image capture system light beams now travel a nearly identical path between entering the motor vehicle window pane and striking the image sensors.

The reduced space requirement also allows for a great reduction in the restriction of the field of view, which results for the driver or the front seat passenger when using the image capture system or the optical system as a forward-directed camera. Furthermore, the see-through window in the motor vehicle window pane is nearly equal in its size as the image sensor itself, i.e. the region of the motor vehicle window pane covered (and thereby "blocked") by the image capture system is optimally utilized. Design aspects of the exterior view of the vehicle are thereby also significantly improved.

Regarding the construction and manufacture of the image capture system according to example embodiments of the present invention, reference may largely be made to the above-cited related art. According to example embodiments of the present invention, it is advantageous in this regard if the micro-lenses are situated in at least one lens plane, it being possible for the at least one lens plane and the image plane preferably to be situated essentially in parallel. This parallelism may in particular ensure that the incident light of all micro-lenses is focused on the associated image sensors. Here too, again a slight deviation from the parallelism, for example, a deviation of up to, but no more than, 5° is possible. The thickness of the image capture system, in particular the distance between a lens plane situated farthest on the object side and the at least one image sensor element, advantageously is less than 20 mm, particularly advantageously no more than 10 mm.

It is furthermore advantageous if the image capture system has an opening angle adapted in particular to the respective field of application. Accordingly, for example, at least one pixel on the edge of the at least one image sensor may have a pick-up direction that deviates by at least 10° with respect to the main viewing direction. Advantageously, a horizontal opening angle is used that is wider than the vertical opening angle of the image capture system. Thus, for example, the maximum deviation of a pick-up direction in a horizontal direction of the at least one image sensor (half opening angle horizontally) may be between 5° and 50°, preferably between 10° and 40°, and in a vertical direction of the at least one image sensor (half opening angle vertically) between 2° and 40°, preferably between 5° (telephoto-like construction) and 20°.

In accordance with the related art, for example, conventional CCD chips or other image sensor elements may be used as image sensor elements. These may be used such, for example, that each of the image sensors (pixels) of the image sensor element is assigned one or more micro-lenses (complete utilization) or, less preferably, only a certain number of the image sensors may be used, other image sensors of the image sensor element remaining unused.

Furthermore, a scattered light suppression may also be provided, the scattered light suppression being set up to prevent light passing through a micro-lens from reaching an opening of the at least one aperture mask that is not assigned to the micro-lens and/or an image sensor that is not assigned to the micro-lens. This may be implemented, for example, in that each micro-lens has a pillar of an optical material, in particular a straight or inclined cylinder, in particular a circular cylinder or a polygonal cylinder, at least one circumferential surface of each pillar having a light-suppressing property. For the light-suppressing development, reference may be made, for example, to the above-cited publication by J. Duparre et al. in Applied Optics.

Exemplary embodiments of the present invention are depicted in the drawings and described in greater detail in the description below.

DETAILED DESCRIPTION

Figure 1:
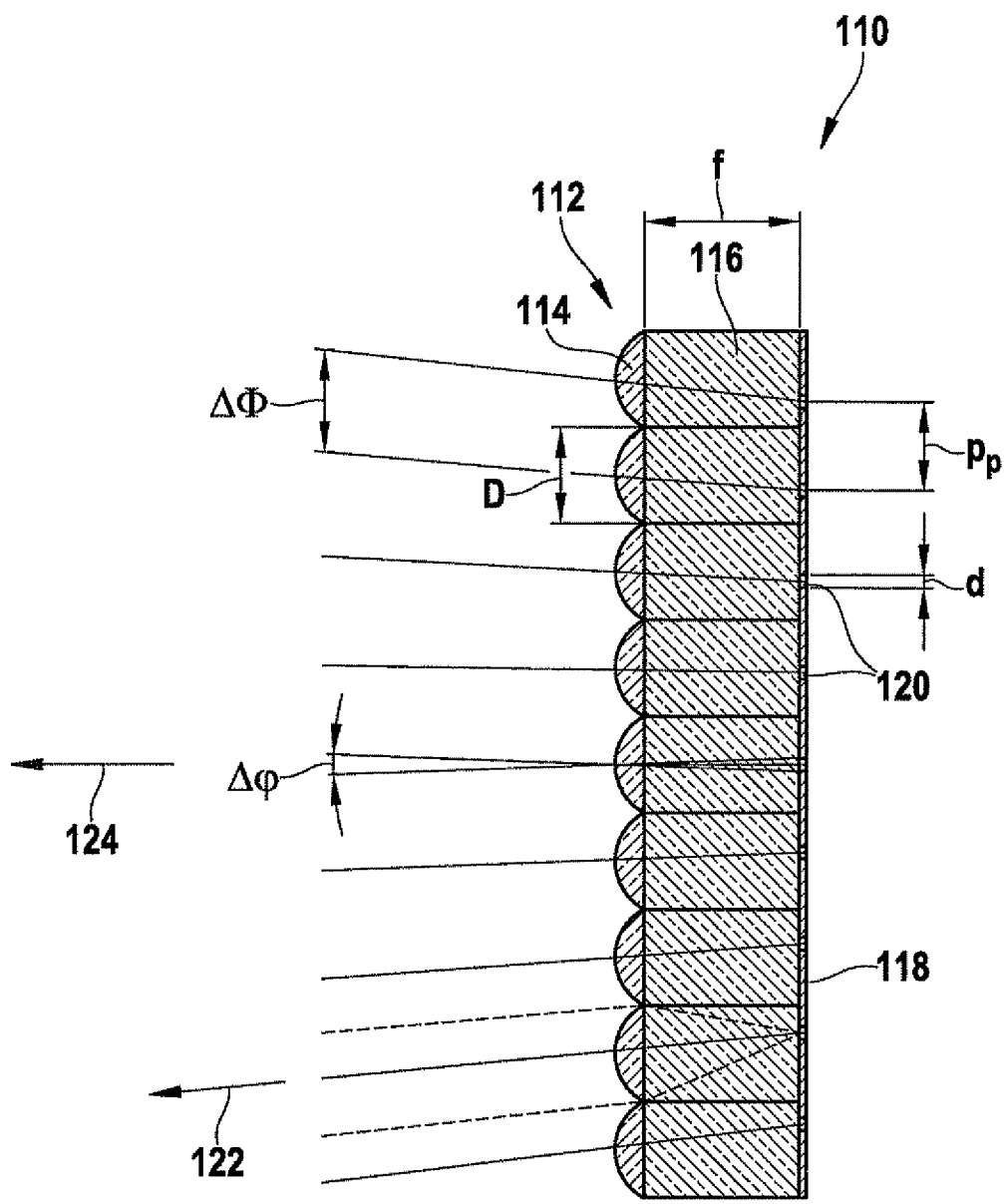
FIG. 1 illustrates a part of a conventional image capture system having a micro-lens system and an aperture mask.

FIG. 1 shows a part of a conventional image capture system 110, the structure and manufacture of which is described, for example, in the above-cited publication by J. Duparre et al. in Applied Optics. Image capture system 110 has a micro-lens system 112 having a plurality of micro-lenses 114 arranged to form a matrix. Each micro-lens 114 has an associated pillar 116 of an optical material, the pillar in this case being a vertical pillar.

Furthermore, an aperture mask 118 is provided, which in this exemplary embodiment is situated directly adjacent to pillars 116. Aperture mask 118 has a plurality of openings 120, one opening 120 being respectively associated with one micro-lens 114. Thus one micro-lens 114 and one opening 120 respectively define a pick-up direction 122 of a pixel. In this example, pick-up direction 122 of the central pixel or central opening 120 defines main viewing direction 124 of image capture system 110. In this image capture system 110, main viewing direction 124 is perpendicular with respect to aperture mask 118 and an image sensor element (not shown in FIG. 1).

Due to the finite diameter d of openings 120 (where, depending on the shape of opening 120, the term "diameter" is not to be understood literally) each assemblage made up of a micro-lens 114 and an opening 120 has an acceptance angle, which is indicated by $\Delta\phi$ in FIG. 1. Adjacent assemblages made up respectively of an opening 120 and a micro-lens 114 have an angular deviation $\Delta\Phi$. Adjacent openings 120 have a distance $p_p$ (pitch). Micro-lenses 114 in turn have a diameter D and a focal length f, the system in FIG. 1 being arranged such that aperture mask 118 is situated just at distance f from the focal plane of micro-lenses 114.

Figure 2:
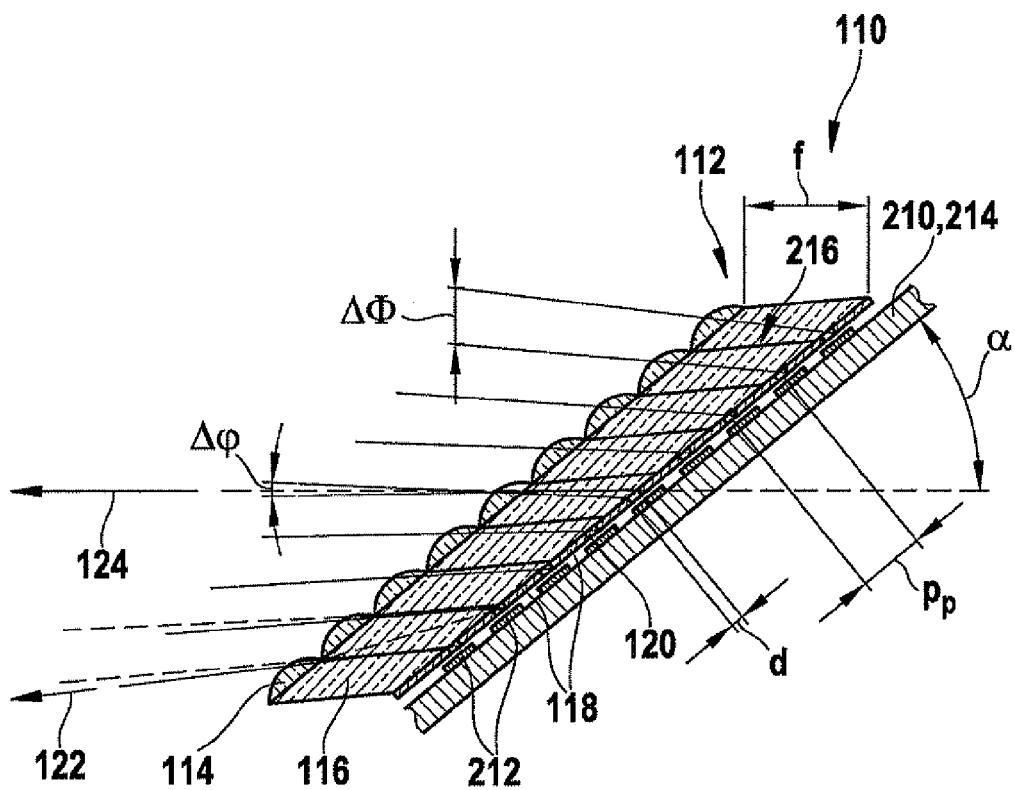
FIG. 2 illustrates a development of an image capture system according to an example embodiment of the present invention.

FIG. 2, by contrast, is a diagrammatic sketch of a thin-profile image capture system 110 according to an example embodiment of the present invention, which is optimized for being mounted on a windshield of a motor vehicle. The image capture system in turn has a micro-lens system 112 having a plurality of micro-lenses 114 having a focal length f and an aperture mask 118 having a plurality of openings 120. Furthermore, FIG. 2 also shows an image sensor element 210 having a plurality of image sensors 212, which is situated directly behind aperture mask 118. Image sensors 212 are in this instance arranged in a planar manner in an image plane 214 defined by image sensor element 210.

In the system shown in FIG. 2, again one micro-lens 114 is respectively associated with one opening 120 in the aperture mask 118 and one image sensor 212 of image sensor element 210. These three elements in turn define a pick-up direction 122 for this group. For the designations $\Delta\phi$, $\Delta\Phi$, d and $p_p$, see FIG. 1.

According to the system in FIG. 2, image capture system 110 again has a main viewing direction 124. In contrast to the conventional arrangement shown in FIG. 1, this main viewing direction 124, however, deviates from 90° in its angular position with respect to image plane 214. Main viewing direction 124 together with image plane 214 rather forms an angle $\alpha$, which in this case is approximately 30°. According to example embodiments of the present invention, this deviation is implemented in that in the development shown in FIG. 2, pillars 116 are not vertical pillars, but rather inclined cylindrical pillars, which ensure that micro-lenses 114 are respectively shifted with regard to associated openings 120 of aperture mask 118. Nevertheless, micro-lenses 114 are situated in a plane that is parallel with respect to image plane 214.

In order to prevent cross feed from micro-lenses 114 to openings 120 not associated with these micro-lenses 114, pillars 116 in the exemplary embodiment shown in FIG. 2 are equipped with a scattered light suppression 216. This scattered light suppression 216 may be effected for example by an opaque development of the circumferential surfaces of pillars 116, as is described, for example, in the publication by J. Duparre et al. in Applied Optics, mentioned at the outset.

Figure 3:
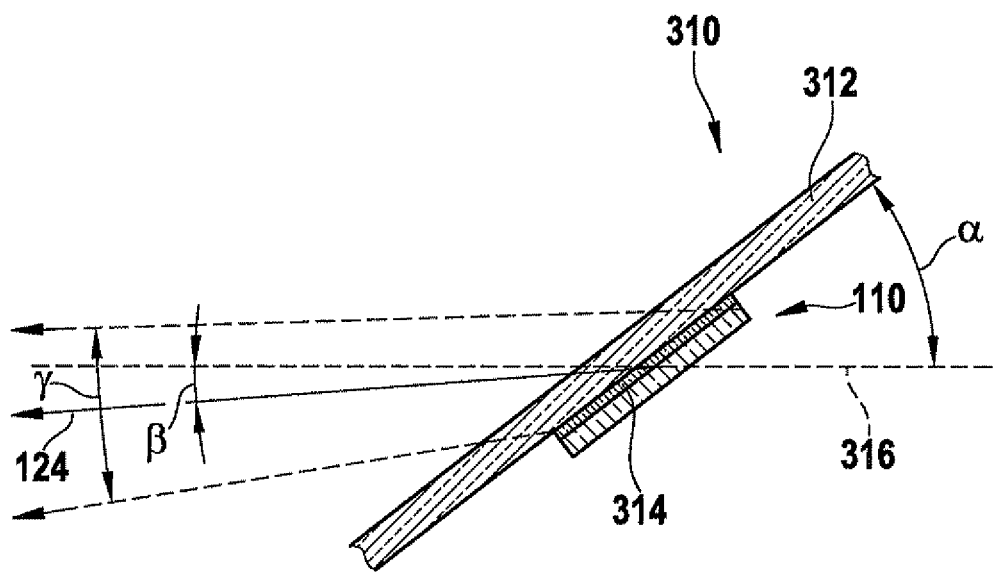
FIG. 3 illustrates an optical system according to an example embodiment of the present invention.

FIG. 3 shows an exemplary embodiment of an optical system 310 for use in an automobile. The optical system has an image capture system 110, for example, in accordance with the development in FIG. 2, as well as a windshield 312. Optical system 310 is in this case situated in parallel with respect to windshield 312 and is attached to windshield 312 by an optical cement 314. Main viewing direction 124 is in this instance tilted downward with respect to horizontal 316 by an angle $\beta$. Image capture system 110 has a vertical opening angle (indicated by y in FIG. 3), which is approximately 15°.

Furthermore, optical system 310 may have additional components that are not shown in FIG. 3. Thus, for example, an electronic evaluation device may be provided, one or more micro-computers for example, in particular having an image detection software. A direct or indirect coupling with other components of the motor vehicle, for example an on-board computer or a central vehicle control unit, is possible as well.

What is claimed is:

1. An image capture system for use in a vehicle, comprising:
    at least one image sensor element having a plurality of image sensors arranged in an image plane and at least one micro-lens system having a plurality of micro-lenses, one image sensor and one micro-lens respectively defining a pick-up direction of the image sensor, a totality of the pick-up directions defining a main viewing direction, and the image plane being defined by a surface of the at least one sensor element, to which surface the image sensors are mounted;
    wherein an angle measured from the main viewing direction to the image plane is positive and less than 80°;
    wherein the mounting is such that the image plane is situated substantially in parallel with respect to at least one of (a) a window pane and (b) a region of a window pane adjacent to the image capture system.

2. The image capture system according to claim 1, wherein at least one aperture mask having a plurality of openings is arranged between the micro-lens system and the at least one image sensor element, each micro-lens being shifted with respect to a corresponding opening in the at least one aperture mask.

3. The image capture system according to claim 1, wherein the angle is at least one of (a) between 15° and 40° and (b) between 20° and 35°.

4. The image capture system according to claim 1, wherein the micro-lenses are arranged in at least one lens plane, the at least one lens plane and the image plane being situated substantially in parallel.

5. The image capture system according to claim 1, wherein at least one of (a) a thickness of the image capture system and (b) a distance between a lens plane arranged farthest on an object side and the at least one image sensor element is at least one of (a) less than 20 mm and (b) no more than 10 mm.

6. The image capture system according to claim 1, wherein at an edge of the at least one image sensor element, the at least one image sensor has a pick-up direction, which deviates by at least 10° with respect to the main viewing direction.

7. The image capture system according to claim 1, wherein a maximum deviation in a horizontal direction of the at least one image sensor is at least one of (a) between 5° and 50° and (b) between 10° and 40°, and in a vertical direction of the at least one image sensor at least one of (a) between 2° and 40° and (b) between 5° and 20°.

8. The image capture system according to claim 1, further comprising a scattered light suppression device adapted to prevent light passing through a micro-lens from reaching an image sensor not to the micro-lens.

9. The image capture system according to claim 1, wherein each micro-lens has a pillar of an optical material, a longitudinal axis of the pillar extending at a non-perpendicular angle relative to the image plane and the pillar including at least one circumferential surface having a light-suppressing property.

10. An optical system for use in an automotive sector, comprising:
a window pane of a motor vehicle; and
an image capture system including at least one image sensor element having a plurality of image sensors arranged in an image plane and at least one micro-lens system having a plurality of micro-lenses, one image sensor and one micro-lens respectively defining a pick-up direction of the image sensor, a totality of the pick-up directions defining a main viewing direction, the image plane being defined by a surface of the at least one sensor element, to which surface the image sensors are mounted, an angle measured from the main viewing direction to the image plane being positive and less than 80°, the image capture system at least one of (a) mounted in the vehicle and (b) mounted on the window pane;
wherein the mounting is such that the image plane is situated substantially in parallel with respect to at least one of (a) the window pane and (b) a region of the window pane adjacent to the image capture system.

11. The optical system according to claim 10, wherein the main viewing direction of the image capture system deviates by an angle of at least one of (a) maximally 20° and (b) maximally 5° from horizontal.

12. The optical system according to claim 10, wherein a space between the image capture system and the window pane is filled with at least one of (a) an optical material and (b) an optical cement.

* * * * *